(12) United States Patent
Minami et al.

(10) Patent No.: US 10,612,130 B2
(45) Date of Patent: Apr. 7, 2020

(54) VACUUM PROCESSING APPARATUS

(71) Applicant: ULVAC, INC., Chigasaki-shi, Kanagawa (JP)

(72) Inventors: Hirofumi Minami, Chigasaki (JP); Takayuki Suzuki, Chigasaki (JP); Kazuhiro Musha, Chigasaki (JP); Hirotoshi Nakao, Chigasaki (JP); Seiichi Satou, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 0 days.

(21) Appl. No.: 16/381,644

(22) Filed: Apr. 11, 2019

(65) Prior Publication Data

US 2019/0233224 A1 Aug. 1, 2019

Related U.S. Application Data

(63) Continuation of application No. PCT/JP2017/039629, filed on Nov. 1, 2017.

(30) Foreign Application Priority Data

Nov. 2, 2016 (JP) .................................. 2016-215115

(51) Int. Cl.
*C23C 14/50* (2006.01)
*H01L 21/677* (2006.01)

(52) U.S. Cl.
CPC ........ *C23C 14/50* (2013.01); *H01L 21/67736* (2013.01)

(58) Field of Classification Search
CPC ......... H01L 21/67736; H01L 21/67739; H01L 21/67751; H01L 21/677; H01L 21/683;
(Continued)

(56) References Cited

U.S. PATENT DOCUMENTS

2006/0157345 A1* 7/2006 Huang .................... C23C 14/56
204/298.02
2008/0233283 A1* 9/2008 Choi ...................... C23C 14/564
427/226
2018/0370733 A1* 12/2018 Nakao ............... H01L 21/67109

FOREIGN PATENT DOCUMENTS

CN    108368605 A    8/2018
JP    S55-54569 A    4/1980
(Continued)

OTHER PUBLICATIONS

Jan. 9, 2018 International Search Report issued in International Patent Application No. PCT/JP2017/039629.
(Continued)

*Primary Examiner* — Glenn F Myers
(74) *Attorney, Agent, or Firm* — Oliff PLC (57) ABSTRACT

A vacuum processing apparatus having a small installation area is provided. A lifting plate is arranges inside a vacuum chamber, and a substrate holding device is arranged on the lifting plate to be able to be lifted up and down. An upper side processing device and a lower side processing device are provided in a processing region located beside a lifting region where the lifting plate moves up and down. An upper side moving device and a lower side moving device make the substrate holding device pass through the processing region, and a transfer device transfers the substrate holding device between the upper side moving device or the lower side moving device and the lifting plate. Because vacuum processing can be performed on the upper side and the lower side, the installation area of the vacuum processing apparatus is small.

7 Claims, 8 Drawing Sheets

(58) Field of Classification Search
CPC ............... H01L 21/34; H01L 21/6719; H01L 21/67748; B65G 49/00; B65G 49/06; B65G 49/07; B65G 2207/06; C23C 14/34; C23C 14/50; C23C 14/56; C23C 14/568; C25D 17/06; H01J 37/3435
USPC ............... 414/217, 331.01, 331.02, 331.03; 198/475.1, 605, 614, 633, 773, 831
See application file for complete search history.

(56) References Cited

FOREIGN PATENT DOCUMENTS

| | | |
|---|---|---|
| JP | H08-96358 A | 4/1996 |
| JP | 2002-176090 A | 6/2002 |
| JP | 2002-288888 A | 10/2002 |
| JP | 2004-285426 A | 10/2004 |
| JP | 2005-171369 A | 6/2005 |
| JP | 2007-31821 A | 2/2007 |
| JP | 2008-520525 A | 6/2008 |
| JP | 2013-131542 A | 7/2013 |
| WO | 2007/123032 A1 | 11/2007 |
| WO | 2008/050662 A1 | 5/2008 |
| WO | 2017/104826 A1 | 6/2017 |

OTHER PUBLICATIONS

Feb. 20, 2019 Office Action issued in Chinese Patent Application No. 201780021217.2.

* cited by examiner

VACUUM PROCESSING APPARATUS

CROSS REFERENCE TO RELATED APPLICATION

This application is a continuation application of Patent Cooperation Treaty Application No. PCT/JP2017/039629, filed on Nov. 1, 2017, which claims priority to Japanese Application No. JP2016-215115, filed on Nov. 2, 2016, the contents of which are incorporated herein by reference.

TECHNICAL FIELD

The present embodiment generally relates to a technical field of a vacuum apparatus, and more particularly to a vacuum apparatus which moves an object to be processed in an air atmosphere and in a vacuum environment.

BACKGROUND

Vacuum processing apparatuses are known to perform processing such as the film formation of a plurality of substrates to be processed while passing through the inside of the vacuum processing apparatus and being placed on a substrate holder, such as a tray.

Among such vacuum processing apparatuses, one having an annular conveyance path is also known. Furthermore, a transfer step includes introducing (loading) substrates to be processed and discharging (unloading) processed substrates.

According to the configuration of the conventional technique, the substrates to be processed go through each process while moving from the loading position to the unloading position along the annular conveyance path formed within a horizontal plane, and with the processing surfaces of the substrate to be processed maintained horizontal.

As a result, according to such a conventional technique, the substrate surfaces to be processed and the area of the auxiliary equipment, including the transfer equipment, are added in the horizontal direction. If the annular track is provided in a space between the processing surface and a plane parallel to the processing surface, even when the annular track extends in the vertical direction, such an area of the equipment is added to the area of the substrate surfaces.

According to the conventional technique, the tray is configured such that a plurality of rows times a plurality of columns of substrates are placed thereon. All the processing region and the auxiliary equipment therefore need to have a size that can fully cover the surface area of the tray. Thus, the foregoing problem of the conventional technique has been a major obstacle in order to reduce installation space.

Now, there is a case where a tray on which substrates to be processed are placed in a row, and a plurality of such trays is placed in a conveyance direction. In such a process, processing starts on the substrate placed at the top of a tray and completes processing on the substrate at the end of the tray. This process inevitably needs a redundant processing region that covers both the lengths of the second to last substrates when the processing of the substrate at the top of the tray starts, and the lengths of the substrate at the top of the tray to the one substrate before the end of the tray when the processing of the substrate at the end of the tray is completed. Therefore, there is a problem of insufficient space saving.

CITATION LIST

Patent Literature

Patent Literature 1: Japanese Patent Application Laid-Open No. 2007-31821
Patent Literature 2: Japanese Patent Application Laid-Open No. 2002-288888
Patent Literature 3: Japanese Patent Application Laid-Open No. 2004-285426
Patent Literature 4: Japanese Patent Application Laid-Open No. 2002-176090
Patent Literature 5: WO2008/050662
Patent Literature 6: Japanese Patent Application Laid-Open No. 8-96358
Patent Literature 7: Japanese Patent Application Laid-Open No. 2013-131542

SUMMARY

The present embodiment has been achieved in view of such a problem of the conventional technique. It is an object of the present embodiment to provide a technique for sufficiently saving space of a vacuum processing apparatus of a passing type.

To solve the foregoing problem, the present embodiment provides a vacuum processing apparatus including a vacuum chamber in which a substrate holding device arranged with an object to be processed having an exposed processing surface, is loaded and unloaded, a lifting device configured to lift the substrate holding device arranged on a lifting plate up and down in the vacuum chamber, an upper side moving device configured to laterally move the substrate holding device in an upper part of the vacuum chamber, a lower side moving device configured to laterally move the substrate holding device in a lower part of the vacuum chamber, and a transfer device configured to transfer the substrate holding device between the lifting plate and the upper side moving device and between the lifting plate and the lower side moving device, wherein the object to be processed arranged on the substrate holding device moved by the upper side moving device is vacuum-processed by an upper side processing device, and the object to be processed arranged on the substrate holding device moved by the lower side moving device is vacuum-processed by a lower side processing device.

In one embodiment, the vacuum processing apparatus further includes an opening formed in the vacuum chamber and a lid member configured to cover the opening so as to form a loading/unloading chamber provided in an upper part of a range where the lifting plate moves up and down. When the object to be processed arranged on the substrate holding device is inserted into the opening, the opening is closed by the lid member.

In another embodiment, the vacuum processing apparatus further includes a vacuum evacuation device configured to vacuum evacuate the loading/unloading chamber.

In yet another embodiment, the vacuum processing apparatus further includes an upper-to-lower transfer device configured to transfer the substrate holding device between the upper side moving device and the lower side moving device.

In yet another embodiment, the vacuum processing apparatus further includes a pin provided on the substrate holding member, the transfer device including a hook engageable with the pin.

In yet another embodiment, the hook is disengaged from the pin by moving the hook either upward or downward.

In yet another embodiment, the transfer device further includes an upper side transfer device configured to transfer the substrate holding device between the lifting plate and the upper side moving device, and a lower side transfer device configured to transfer the substrate holding device between the lifting plate and the lower side moving device.

Advantageous Effects

According to the present embodiment, there are two stages of processing regions including an upper side processing region and a lower side processing region, so that an arrangement can reduce the installation area of the vacuum processing apparatus.

The loading/unloading chamber can be formed by airtightly covering the opening with the lifting plate. Since the width of the loading/unloading chamber in the height direction can be reduced, the capacity of the loading/unloading chamber can be reduced and the time needed for loading/unloading operations can be reduced as well.

DETAILED DESCRIPTION OF EMBODIMENTS

<Lifting Movement>

Figure 5:
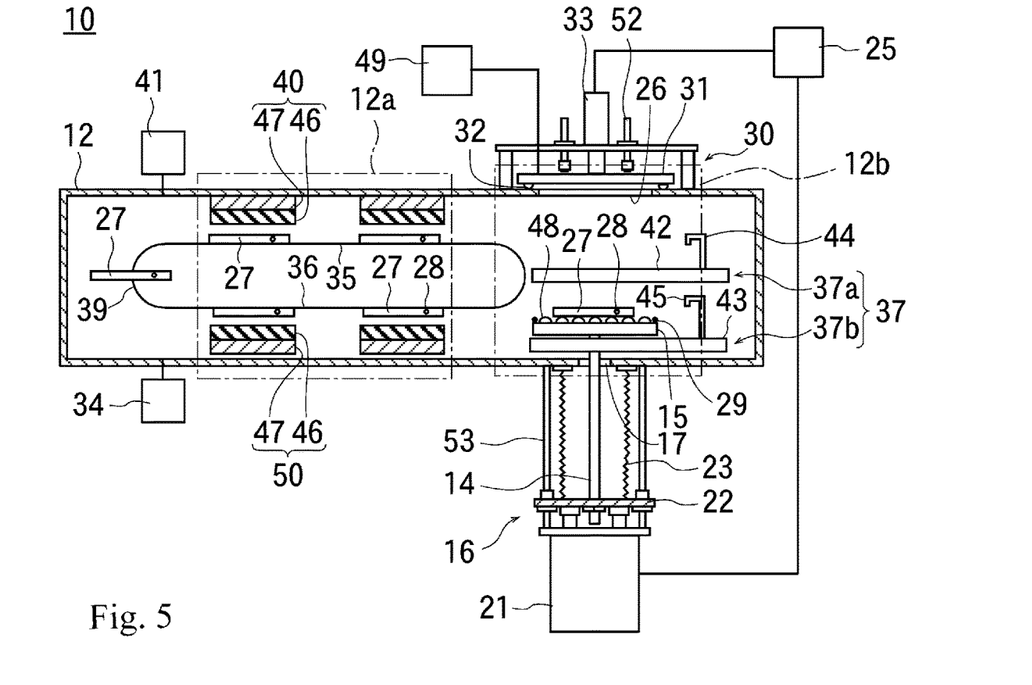
FIG. 5 is a diagram (5) describing the vacuum processing apparatus.

With respect to FIG. 5, a vacuum processing apparatus 10 performs vacuum processing on objects to be processed. The vacuum processing apparatus 10 includes a vacuum chamber 12. A lifting device 16 is provided on the vacuum chamber 12.

Inside the vacuum chamber 12, a region where the vacuum processing is performed on the objects to be processed is referred to as a processing region 12a, and a region where an object to be processed is lifted up and down by the lifting device 16 is referred to as a lifting region 12b. The processing region 12a and the lifting region 12b communicate with each other and are in a vacuum environment of the same pressure.

The lifting device 16 includes a lifting shaft 14 and a lifting plate 15 provided on the top end of the lifting shaft 14. A lifting hole 17 is formed in the bottom of the vacuum chamber 12 located below the lifting region 12b. The lifting plate 15 is located in the lifting region 12b inside the vacuum chamber 12. The lifting shaft 14 is vertically inserted into the lifting hole 17 in a manner such that a lower portion of the lifting shaft 14 is located below the lifting region 12b.

A lifting force generation device 21 is arranged outside the vacuum chamber 12, below the lifting region 12b. The lower portion of the lifting shaft 14 is fixed to a seat plate 22, which is provided on the top end of the lifting force generation device 21.

A bellows 23, which surrounds the lifting hole 17 and the lifting shaft 14, is arranged in a manner such that the top end of the bellows 23 is airtightly fixed to a surface of the bottom of the vacuum chamber 12 opposite from inside, i.e., the outside surface of the bottom around the lifting hole 17. The lower end of the bellows 23 is airtightly fixed to the seat plate 22 around the position where the lower portion of the lifting shaft 14 is fixed.

The lifting force generation device 21 is connected to a control device 25. An operation of the lifting force generation device 21 is controlled by the control device 25. When the lifting force generation device 21 is controlled and operated to generate an upward moving force, the seat plate 22 moves up while the bellows 23 contracts. As a result, the lifting plate 15, together with the lifting shaft 14 moves upward inside the vacuum chamber 12. The airtightness of the vacuum chamber 12 is maintained during the movement.

On the other hand, when the lifting force generation device 21 is controlled and operated to generate a downward moving force, the seat plate 22 moves down while the bellows 23 expands. The lifting plate 15 together with the lifting shaft 14 moves down inside the vacuum chamber 12. The airtightness of the vacuum chamber 12 is also maintained during the movement.

An opening 26 is formed in the ceiling of the vacuum chamber 12 above the lifting region 12b, where the ceiling intersects with the extension of the moving direction of the lifting plate 15.

An inner hermetic seal ring 29 is provided on an outer peripheral portion of the upward surface of the lifting plate 15. A substrate holding device 27 is arranged on the lifting plate 15, inside the inner hermetic seal ring 29. Here, an O-ring is used as the inner hermetic seal ring 29.

A plate-shaped lid unit 31 is arranged above the opening 26. The lid unit 31 is attached to a pressing device 33 which is arranged outside the vacuum chamber 12 and connected to the control device 25. The pressing device 33 moves the lid unit 31 vertically downward or vertically upward according to control of the control device 25. The reference numeral 52 denotes a guide for the movement of the lid unit 31.

An outer hermetic ring 32 is arranged on a bottom surface of the lid unit 31 facing vertically-downward.

The vacuum chamber 12 is connected to a main vacuum evacuation device 34. When the interior of the vacuum chamber 12 is vacuum evacuated, the lid unit 31 is moved by the pressing device 33 in a manner such that the outer hermetic ring 32 provided on the lid unit 31 comes into contact with the ceiling portion of the vacuum chamber 12 so as to surround the opening 26. The lid unit 31 is pressed against the ceiling portion of the vacuum chamber 12 by the pressing device 33, and the outer hermetic ring 32 is brought into close contact with the portion of the vacuum chamber 12 around the opening 26 and with the lid unit 31.

In such a state, the opening 26 is airtightly covered with the lid unit 31, and the vacuum chamber 12 is hermetically sealed. When the main vacuum evacuation device 34 is activated, the interior of the vacuum chamber 12 is vacuum evacuated to form a vacuum environment.

Figure 6:
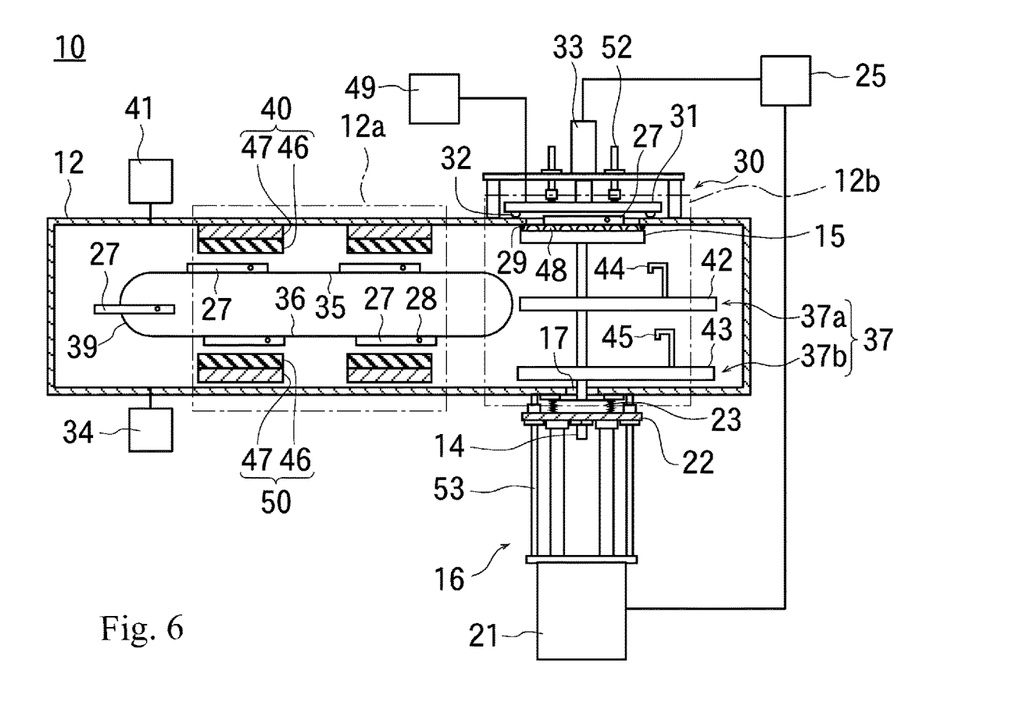
FIG. 6 is a diagram (6) describing the vacuum processing apparatus.

When the vacuum environment is formed in the vacuum chamber 12, the lifting force generation device 21 operates to move upward the lifting plate 15 on which the substrate holding device 27 placed while the main vacuum evacuation device 34 vacuum evacuates the vacuum chamber 12. As shown in FIG. 6, the substrate holding device 27 enters inside of the opening 26, and the inner hermetical ring 29 comes into contact with the ceiling of the vacuum chamber 12.

When the lifting plate 15 is pressed against the ceiling of the vacuum chamber 12 by the operation of the lifting force generation device 21, the inner hermetic seal ring 29 makes close contact with the ceiling of the vacuum chamber 12 and the lifting plate 15.

The lifting plate 15 has no hole. When the inner hermetic seal ring 29 is in contact with the ceiling of the vacuum chamber 12, the opening 26 is closed, and the vacuum chamber 12 is hermetically sealed by both the lid unit 31 and the lifting plate 15. A loading/unloading chamber 30, which is isolated from the air, is formed by the lid unit 31, the opening 26 of the vacuum chamber 12, and the lifting plate 15.

Figure 7:
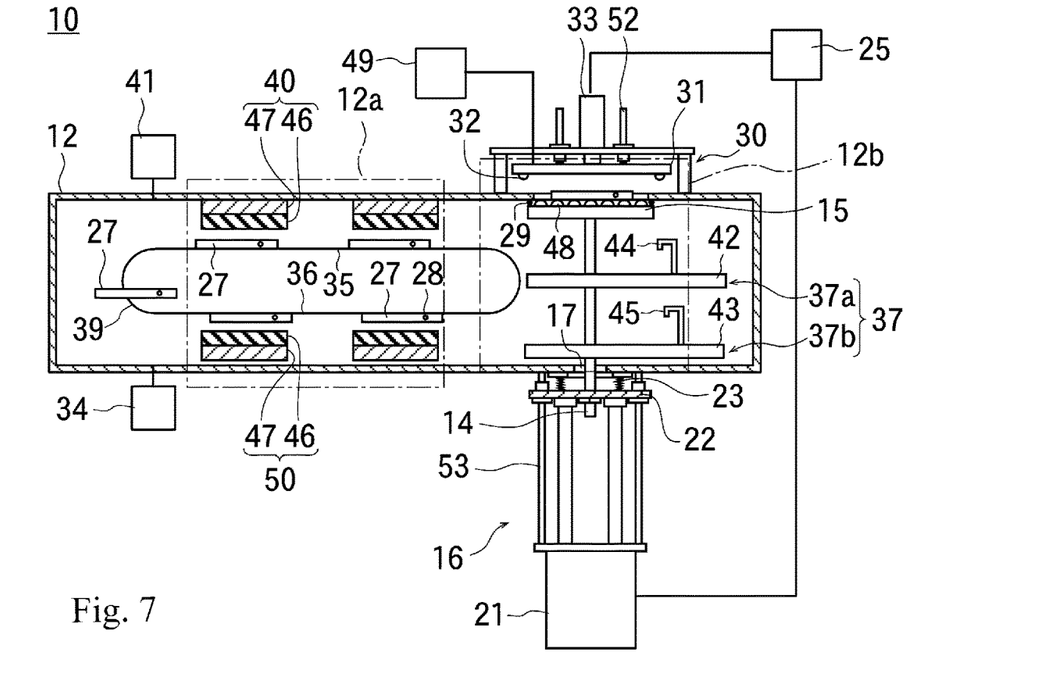
FIG. 7 is a diagram (7) describing the vacuum processing apparatus.

The interior of the loading/unloading chamber 30 in such a state is in a vacuum environment. After a gas such as air is introduced into the interior of the loading/unloading chamber 30 from a gas introduction device, or the like, connected to the lid unit 31 and the interior of the loading/unloading chamber 30 is set to atmospheric pressure, the lid unit 31 is moved up to open the loading/unloading chamber 30 to the air, as shown in FIG. 7.

At the time, the opening 26 is hermetically sealed by the lifting plate 15, the main vacuum evacuation device 34 is running, and the vacuum environment inside the vacuum chamber 12 is maintained.

Figure 12:
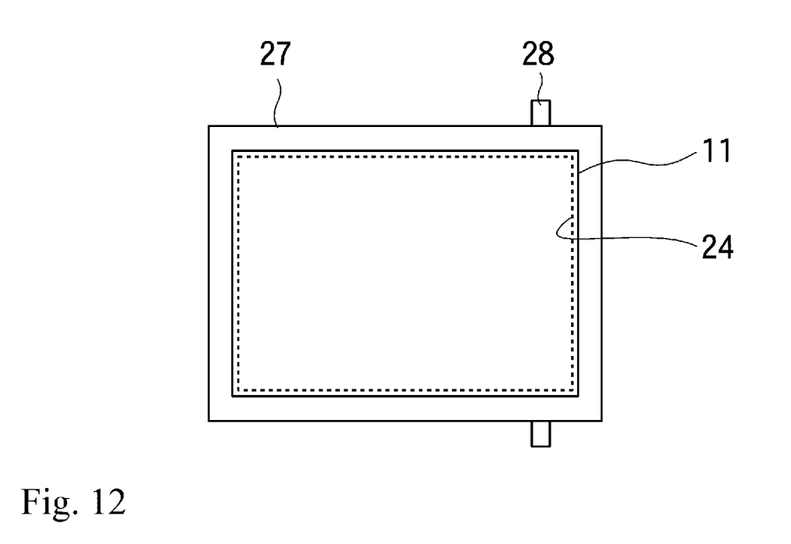
FIG. 12 is a diagram describing a positional relationship between an object to be processed and a substrate holding device.

As shown in FIG. 12, an object to be processed 11 is arranged on the substrate holding device 27. When the loading/unloading chamber 30 is opened to the air, the substrate holding device 27 and the object to be processed 11 arranged on the substrate holding device 27 are exposed to the air atmosphere.

The object to be processed 11 on the substrate holding device 27 exposed to the air atmosphere is moved from the substrate holding device 27 to another apparatus by the transfer robot provided on the outside of the vacuum chamber, and an unprocessed object to be processed 11 is arranged on the substrate holding device 27.

Next, when the lid unit 31 is lowered to bring the outer hermetic ring 32 into contact with the periphery of the opening 26, and the opening 26 is airtightly covered with the lid unit 31. The inside of the vacuum chamber 12 is hermetically sealed by both the outer hermetic ring 32 and the inner hermetic seal ring 29. The lid unit 31, the opening 26 of the vacuum chamber 12, and the lifting plate 15 form the loading/unloading chamber 30.

Figure 8:
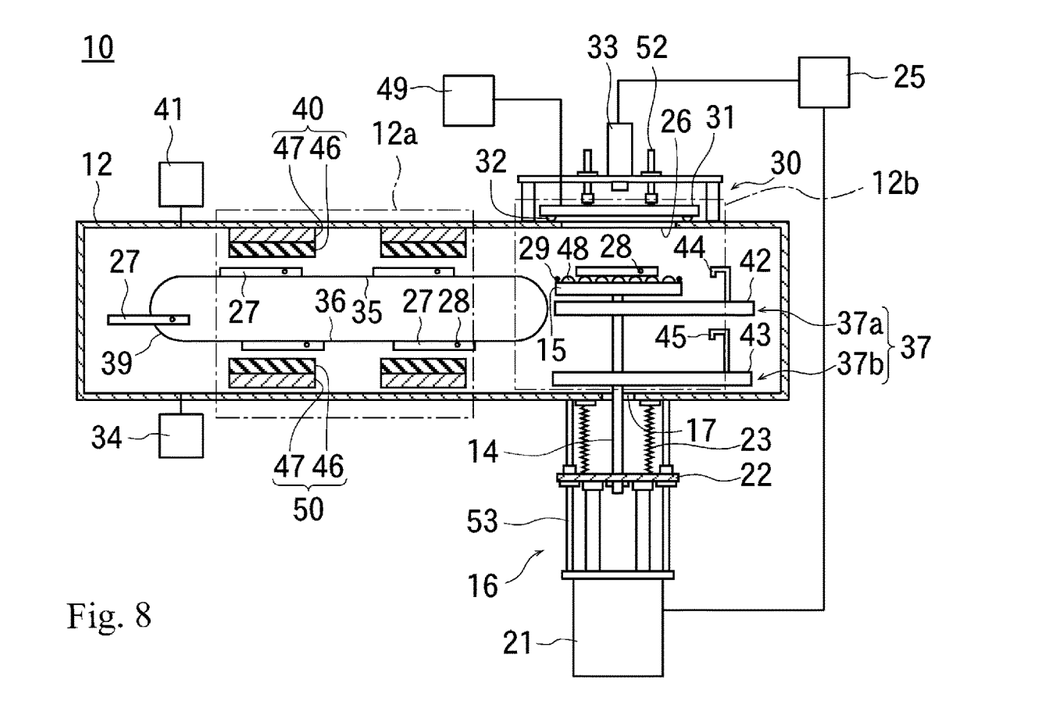
FIG. 8 is a diagram (8) describing the vacuum processing apparatus.

The interior of the loading/unloading chamber 30, in this state, is in the air atmosphere. A sub vacuum evacuation device 49, connected to the loading/unloading chamber 30, is operated to vacuum evacuate the interior of the loading/unloading chamber 30. When a vacuum environment of predetermined pressure is formed inside of the loading/unloading chamber 30, the lifting plate 15 is lowered by the lifting force generation device 21, as shown in FIG. 8, whereby the substrate holding device 27 and the object to be processed 11 arranged on the substrate holding device 27 are carried into the vacuum chamber 12. The vacuum environment in the vacuum chamber 12 is maintained by the lid unit 31.

In the foregoing example, the sub vacuum evacuation device 49 is activated to vacuum evacuate the interior of the loading/unloading chamber 30. However, a valve may be installed between the sub vacuum evacuation device 49 and the lid unit 31, and the interior of the loading/unloading chamber 30 may be vacuum evacuated by opening the valve while the sub vacuum evacuation device 49 running.

As discussed above, the lifting plate 15 moves up and down within the lifting region 12b. The processing region 12a is located beside the lifting region 12b inside the vacuum chamber 12. An upper side moving device 35 is provided in an upper part of the vacuum chamber 12, and a lower side moving device 36 is provided on a lower side of the upper side moving device 35, so as to pass through the processing region 12a. Here, the up and down movement refers to movements in both directions, including an upward movement in a vertical or near vertical direction and a downward movement in the vertical or near vertical direction.

The upper side moving device 35 and the lower side moving device 36 each are devices for moving substrate support devices 27 in a lateral direction. A transfer device 37 for transferring a substrate holding device 27 between the upper side and lower side moving devices 35 and 36 and the lifting plate 15 is arranged inside the vacuum chamber 12. The lateral direction is a direction perpendicular to the direction of the up and down movement. Here, a movement in the lateral direction refers to a movement in a horizontal or near horizontal direction.

In this example, the transfer device 37 includes an upper side transfer device 37a which transfers a substrate holding device 27 between the upper side moving device 35 and the lifting plate 15, and a lower side transfer device 37b which transfers a substrate holding device 27 between the lower side moving device 36 and the lifting plate 15. The lower side transfer device 37b is arranged below the upper side transfer device 37a.

The upper side transfer device 37a includes an upper side slider 42 and an upper side hook 44. The lower side transfer device 37b includes a lower side slider 43 and a lower side hook 45.

The upper side slider 42 is arranged to extend from beside the lifting region 12b to near the upper side moving device 35. The lower side slider 43 is arranged to extend from beside the lifting region 12b to near the lower side moving device 36.

According to control of the control device 25, the upper side transfer device 37a laterally moves the upper side hook 44 along the upper side slider 42, and the lower side transfer device 37b laterally moves the lower side hook 45 along the lower side slider 43. Furthermore, according to control of the control device 25, the upper side transfer device 37a and the lower side transfer device 37b also individually move the upper side hook 44 and the lower side hook 45, respectively, in the vertical direction.

Figure 1:
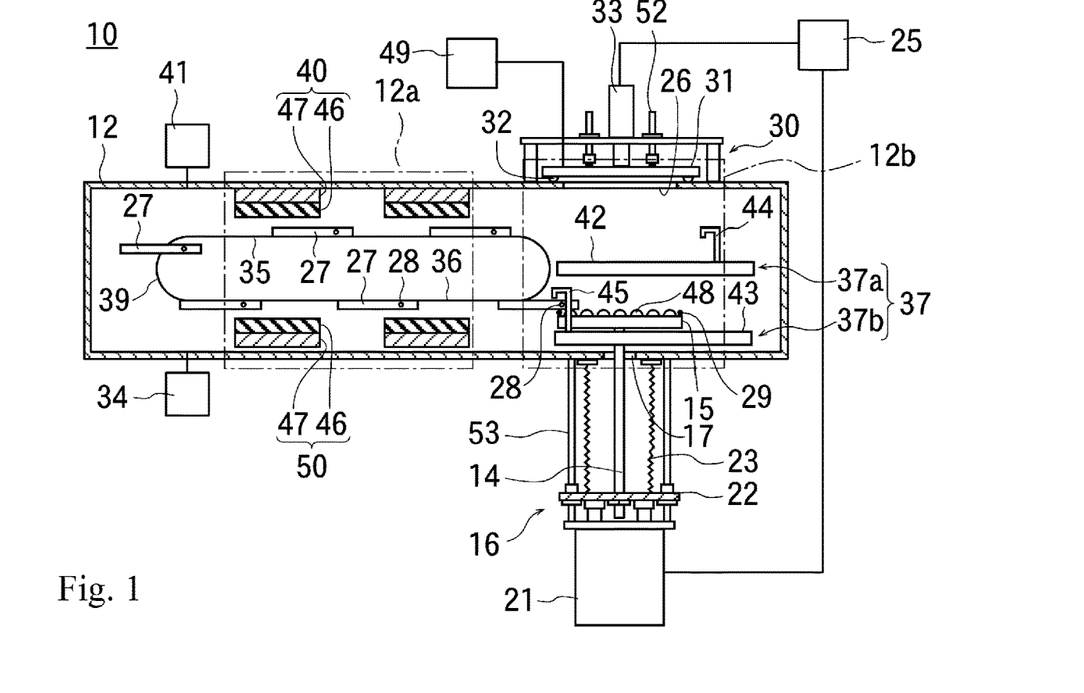
FIG. 1 is a diagram (1) describing a vacuum processing apparatus.

In FIG. 1, the lifting plate 15 on which no substrate holding device 27 rest at a predetermined position in a lower part of the lifting region 12b. A substrate holding device 27 is transferred from above the lifting plate 15 to the upper side moving device 35 by the upper side transfer device 37a, arranged on the upper side moving device 35, and moved through the processing region 12a by the upper side moving device 35. Then the substrate holding device 27 is transferred from the upper side moving device 35 to the lower side moving device 36 by an upper-to-lower transfer device 39 arranged inside the vacuum chamber 12. After the substrate holding device 27 is moved through the processing region 12a by the lower side moving device 36, the substrate holding device 27 reaches a position where the substrate holding device 27 is transferred to the lower side transfer device 37b.

An upper side processing device 40 is arranged in the processing region 12a inside the vacuum chamber 12, at a position to face the object to be processed 11 arranged on the substrate holding device 27 moved by the upper side moving device 35. A lower side processing device 50 is arranged in the processing region 12a inside the vacuum chamber 12, at a position to face the object to be processed 11 arranged on the substrate holding device 27 moved by the lower side moving device 36.

Because the upper side moving device 35 moves the object to be processed 11 having the surface upward, the upper side processing device 40 is arranged to face the upward surface of the object to be processed 11. After the surface of the object to be processed 11 is vacuum-processed by the upper side processing device 40, the object to be processed 11 is transferred from the upper side moving device 35 to the upper-to-lower transfer device 39.

In this example, the upper-to-lower transfer device 39 transfers the object to be processed 11 to the lower side moving device 36 without changing the orientation of the object to be processed 11. The surface of the object to be processed 11 in the substrate holding device 27 arranged on the lower side moving device 36 is directed upward.

As shown in FIG. 12, an open window portion 24 which is a through hole, is formed in the bottom surface of the substrate holding device 27. The object to be processed 11 is larger than the open window portion 24, and is arranged on the bottom surface of the substrate holding member 27 in which the open window portion 24 is formed, while the peripheral portion of the object to be processed 11 is in contact with the bottom surface of the substrate holding member 27. The back surface of the object to be processed 11, as arranged on the substrate holding device 27, is thus exposed downward.

The lower side processing device 50 is arranged at a lower position of the processing region 12a. The lower side moving device 36 is arranged in a manner such that the back surface of the object to be processed 11 can face the lower side processing device 50. The back surface of the object to be processed 11 arranged on the substrate holding device 27 moving through the processing region 12a by the lower side moving device 36 is vacuum-processed by the lower side processing device 50.

Here, the upper side processing device 40 and the lower side processing device 50 each have a plurality of target devices. The upper side processing device 40 and the lower side processing device 50 thus include backing plates 47 of the target devices and sputtering targets 46 fixed to the respective backing plates 47.

While the main vacuum evacuation device 34 maintained running, a sputtering gas is introduced from a gas introduction device 41 into the interior of the vacuum chamber 12 in the vacuum environment, whereby the interior of the vacuum chamber 12 is put in a sputtering gas atmosphere. A voltage is applied to the backing plates 47, and plasma is formed near the surfaces of the sputtering targets 46. The sputtering targets 46 of the upper side processing device 40 and the sputtering targets 46 of the lower side processing device 50 are sputtered by the plasma. Furthermore, a thin film is formed on the top surface of the object to be processed 11 when the object to be processed 11 is opposed to the upper side processing device 40. A thin film is formed on the back surface of the object to be processed 11 when the object to be processed 11 is opposed to the lower side processing device 50. The sputtering gas atmosphere is a vacuum environment having pressure lower than the atmospheric pressure.

Here, the upper side moving device 35 and the lower side moving device 36 are horizontally arranged in parallel with each other. For example, the upper side moving device 35 and the lower side moving device 36 may include a plurality of conveyance rollers that make contact with the edge of the substrate holding device 27, and a rotating device for rotating the conveyance rollers (the conveyance rollers and the rotating device are not shown in the figures).

The plurality of conveyance rollers is arranged in the moving direction of the substrate holding device 27. The substrate holding device 27 can be moved on the conveyance rollers.

In this example, pins 28 are provided on the substrate holding device 27. As will be described later, the upper side hooks 44 and the lower side hooks 45 are configured to be engageable with the pins 28.

Figure 2:
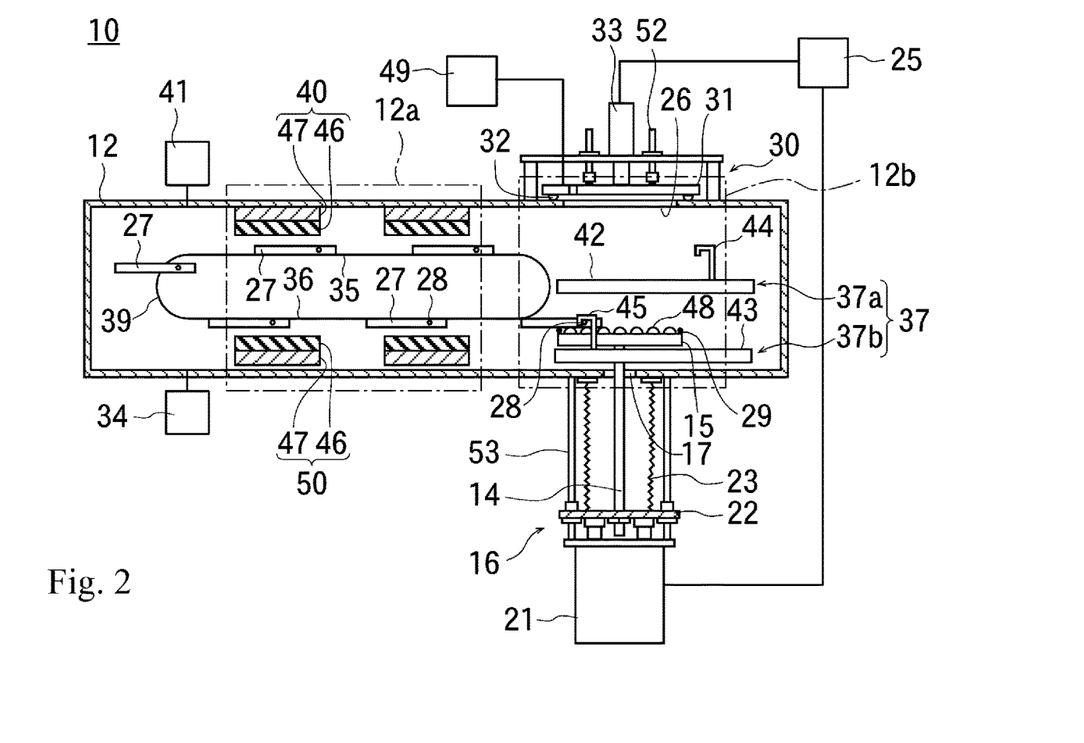
FIG. 2 is a diagram (2) describing the vacuum processing apparatus.

For example, FIG. 1 shows in a state in which a substrate holding device 27 is moved to near the lifting region 12b by the lower side moving device 36. The top ends of the lower side hooks 45 are located above the pins 28 by the lower side transfer device 37b. As shown in FIG. 2, when the lower side hooks 45 are lowered, the pins 28 and the lower side hooks 45 (here, the top ends of the lower side hooks 45) are engaged.

Figure 3:
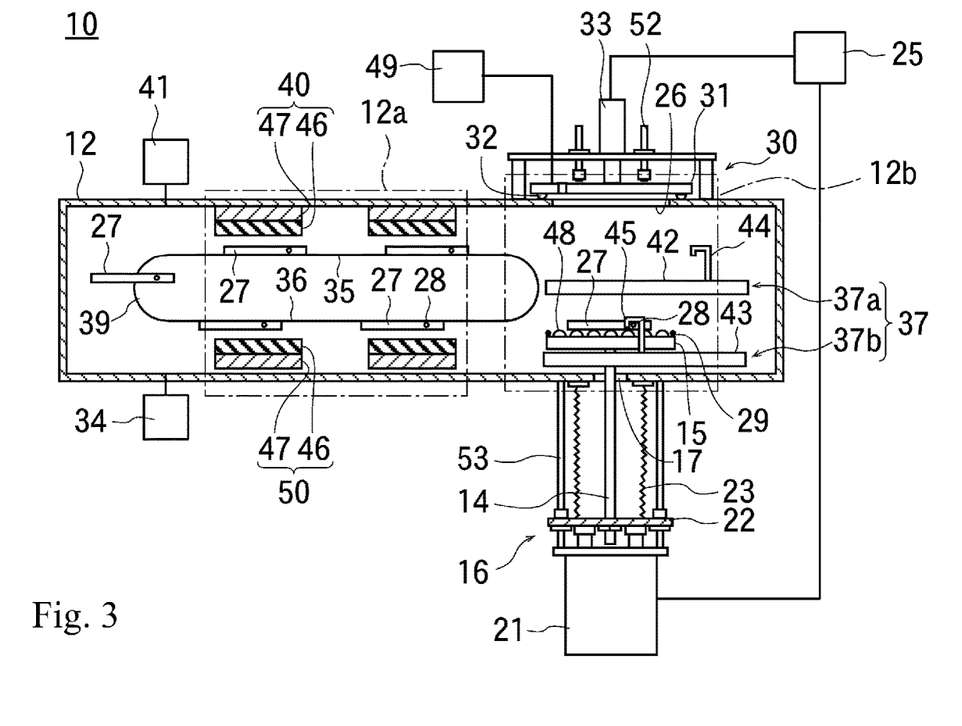
FIG. 3 is a diagram (3) describing the vacuum processing apparatus.

Next, when the lower side hooks 45 are moved in a direction away from the processing region 12a, the substrate holding device 27 of which the pins 28 are engaged with the lower side hooks 45 moves together with the lower side hooks 45. As shown in FIG. 3, the substrate holding device 27 is transferred onto the lifting plate 15.

A plurality of rollers 48 is arranged on the surface of the lifting plate 15 in a direction along the moving direction of the substrate holding device 27. When the lower side hooks 45 are moved further, the substrate holding device 27 moves while rotating the rollers 48 of the lifting plate 15, and reaches a predetermined position on the lifting plate 15.

Figure 4:
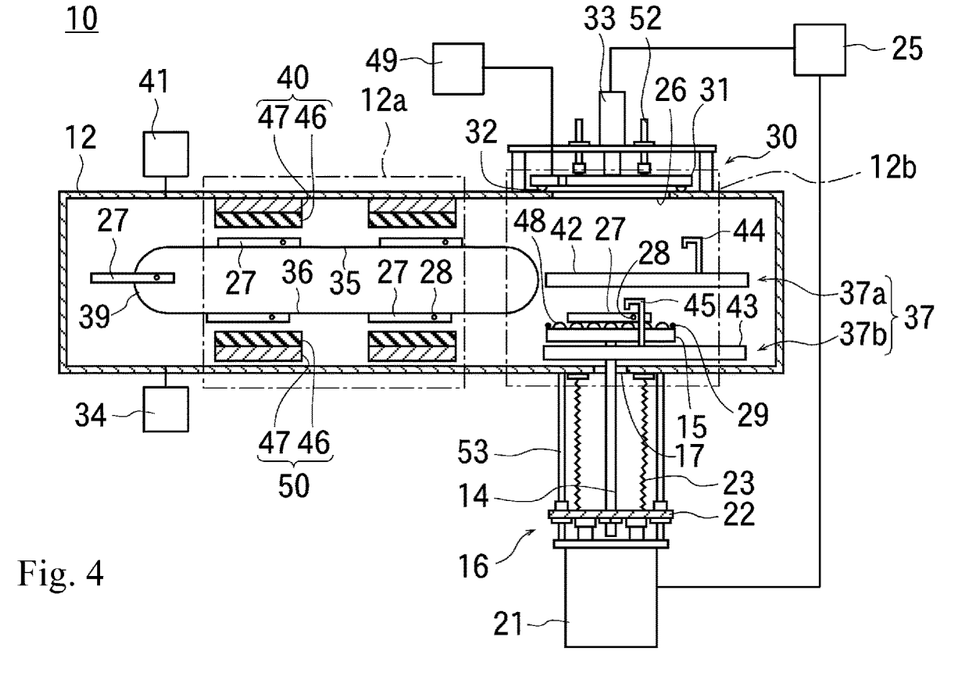
FIG. 4 is a diagram (4) describing the vacuum processing apparatus.

Next, the lower side hooks 45 are raised as shown in FIG. 4, and then moved further in the direction away from the processing region 12a as shown in FIG. 5. The lower side hooks 45 reach a retracted position not to interfere with an upward movement of the lifting plate 15, and the lifting plate 15 becomes able to lift.

Meanwhile, the upper side sliders 42 also are already arranged in a retracted position not to interface with the upward movement of the lifting plate 15. As shown in FIG. 6, when the inner hermetic seal ring 29 of the lifting plate 15 is brought into contact with the ceiling portion of the vacuum chamber 12, and the lifting plate 15 is pressed against the ceiling of the vacuum chamber 12, the opening 26 is airtightly covered with the lifting plate 15 so as to form the hermitically sealed loading/unloading chamber 30.

Here, because the opening 26 is airtightly covered with the lid unit 31 as discussed above, the interior of the formed loading/unloading chamber 30 is in a vacuum environment. After a gas is introduced into the loading/unloading chamber 30 so as to make atmospheric pressure, the lid unit 31 is moved up, as shown in FIG. 7, to open the interior of the loading/unloading chamber 30 to the air. The object to be processed 11 arranged on the substrate holding device 27 on the lifting plate 15 is moved to another apparatus, and an unprocessed object is arranged on the substrate holding device 27. Then, the lid unit 31 is lowered and pressed to airtightly cover the opening 26. The loading/unloading chamber 30 in the hermetically sealed state is vacuum evacuated to a vacuum environment by the sub vacuum evacuation device 49.

The sub vacuum evacuation device 49 may be the same device as the main vacuum evacuation device 34 for vacuum evacuating the vacuum chamber 12. However, for example, the main vacuum evacuation device 34 maintains the interior of the vacuum chamber 12 as a clean vacuum, while the sub vacuum evacuation device 49 repeatedly evacuates the air atmosphere in the loading/unloading chamber 30 to form the vacuum environment. The interior of the vacuum chamber 12 may fail to be maintained as a clean vacuum, if the main vacuum evacuation device 34 and the sub vacuum evacuation device 49 are configured to be the same device. Therefore, the main vacuum evacuation device 34 for vacuum evacuating the vacuum chamber 12, and the sub vacuum evacuation device 49 for vacuum evacuating the loading/unloading chamber 30 are preferably configured as different vacuum devices.

After the interior of the loading/unloading chamber 30 is evacuated to a predetermined pressure, as illustrated in FIG. 8, the lifting plate 15 is lowered. The movement of the lifting plate 15 is stopped when the object to be processed 11 on the substrate holding device 27 comes to the same height as the objects to be processed 11 on the upper side moving device 35.

Figure 9:
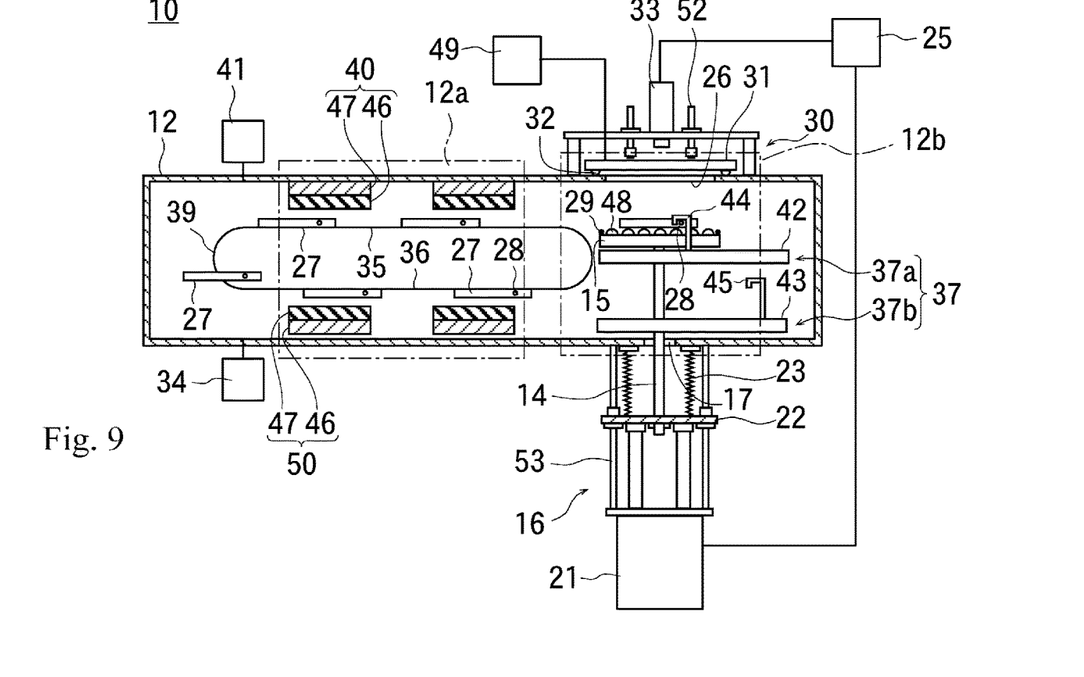
FIG. 9 is a diagram (9) describing the vacuum processing apparatus.

The upper side hooks 44 are moved in advance on the upper side sliders 42 to a retracted position farther from the processing region 12a than the lifting region 12b, and not to interfere with the movement of the lifting plate 15. From that position, the upper side hooks 44 are then moved in a direction toward the processing region 12a. When the top ends of the upper side hooks 44 come to above the pins 28 of the substrate holding device 27 on the lifting plate 15, the movement of the upper side hooks 44 is stopped. As shown in FIG. 9, the upper side hooks 44 are lowered in a manner such that the upper side hooks 44 are engaged with the pins 28.

Figure 10:
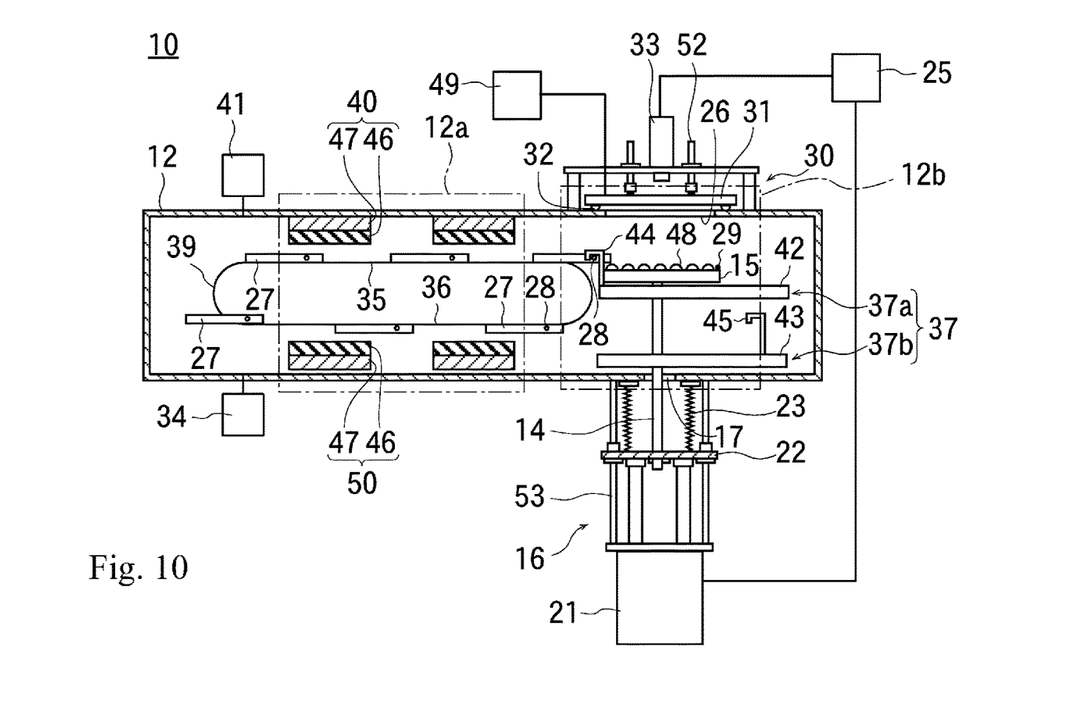
FIG. 10 is a diagram (10) describing the vacuum processing apparatus.

When the upper side hooks 44 in such a state are moved in the direction toward the processing region 12a, the substrate holding device 27 moves together with the upper side hooks 44 while rotating the rollers 48 on the lifting plate 15. Thus, the substrate holding device 27 is placed on the upper side moving device 35 as shown in FIG. 10.

As discussed above, the substrate holding device 27 moved by the upper side moving device 35 passes through the upper part of the processing region 12a, and the surface of the object to be processed 11 is vacuum-processed by the upper side processing device 40. The substrate holding device 27 is then moved to the lower side moving device 36 by the upper-to-lower transfer device 39. The substrate holding device 27 moved by the lower side moving device 36 moves in the lower part of the processing region 12a, and the back surface of the object to be processed 11 exposed at the bottom of the open window portion 24 is vacuum-processed by the lower side processing device 50.

Figure 11:
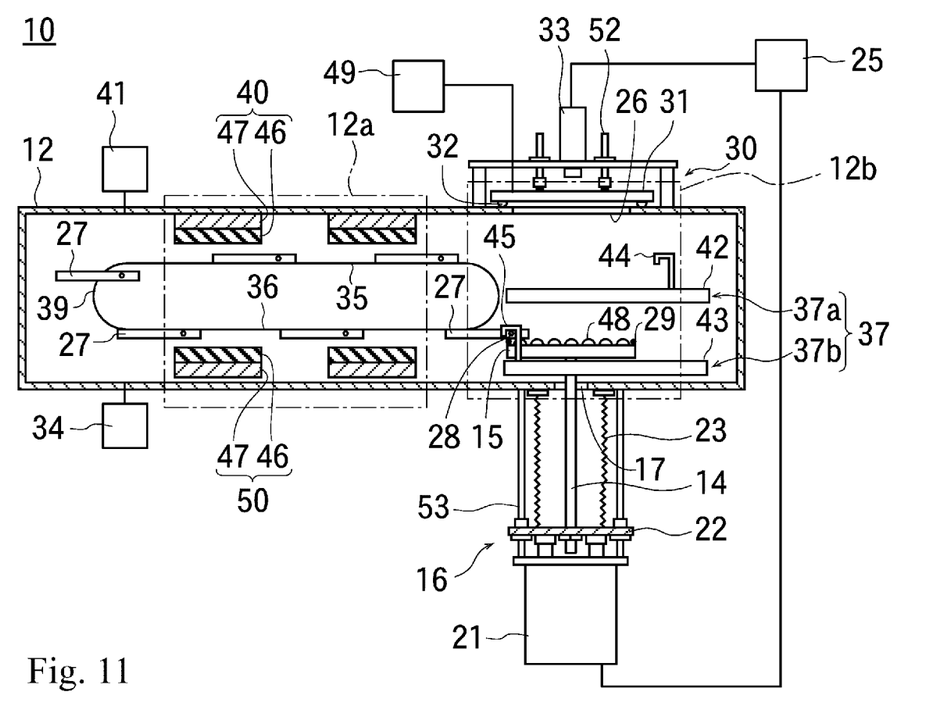
FIG. 11 is a diagram (11) describing the vacuum processing apparatus.

Here, as shown in FIG. 11, among the substrate holding devices 27 on which the objects to be processed 11 vacuum-processed by the upper side processing device 40 and the lower side processing device 50, the pins 28 of the substrate holding device 27 closest to the lifting region 12b are engaged with the lower side hooks 45 of the lower side transfer device 37b, and transferred to the lowered lifting plate 15.

Next, the lifting plate 15 is lifted up, and the object to be processed 11 arranged on the substrate holding device 27 is positioned in the loading/unloading chamber 30 as discussed above. The object to be processed 11 is then taken out in the air atmosphere, and moved to another apparatus, and an unprocessed object to be processed is arranged on the substrate holding device 27 on the lifting plate 15.

In the foregoing example, the front surface and the back surface of the object to be processed 11 are subjected to the vacuum processing. By contrast, when the upper-to-lower transfer device 39 transfers the substrate holding device 27 from the upper side moving device 35 to the lower side moving device 36, the upper-to-lower transfer device 39 may reverse the directions of the substrate holding device 27 and the object to be processed 11 together in a manner such that the upward front surface of the object to be processed 11 is directed downward. Thus, the front surface of the object to be processed 11 vacuum-processed by the upper side processing device 40 may be opposed to the lower side processing device 50 so that the front surface vacuum-processed by the upper side processing device 40 is further vacuum-processed by the lower side processing device 50.

For example, the lower side processing device 50 may form a thin film on the surface of the thin film formed by the upper side processing apparatus 40.

In the foregoing example, the substrate holding device 27 arranged on the upper side moving device 35 is moved to the lower-side moving device 36 by the upper-to-lower transfer device 39. However, the upper side processing device 40 and the lower side processing device 50 may perform the vacuum processing on the object to be processed 11 by: reciprocating the substrate holding device 27 arranged on the upper side moving device 35; moving the reciprocated substrate holding device 27 from the upper side moving device 35 onto the lifting plate 15 by the upper side transfer device 37a; lowering the lifting plate 15; moving the substrate holding device 27 from the lifting plate 15 to the lower side moving device 36 by the lower side transfer device 37b; and reciprocating the substrate holding device 27 arranged on the lower side moving device 36.

Moreover, in the foregoing example, the lifting plate 15 is lifted up, and the object to be processed 11 arranged on the substrate holding device 27 is positioned in the loading/unloading chamber 30. Then, the object to be processed 11 is taken out in the air atmosphere, and moved to another apparatus, and an unprocessed object to be processed is arranged on the substrate holding device 27 on the lifting plate 15. However, the entire substrate holding device 27 on which the object to be processed 11 is arranged may be moved to another apparatus, and an entire substrate holding device 27 on which an unprocessed object to be processed 11 is arranged may be directly arranged on the lifting plate 15. This can reduce the replacing time, for example, if a plurality of objects to be processed 11 is arranged on a substrate holding device 27.

The object to be processed 11 which is finished vacuum processing, arranged on the substrate holding device 27 is moved onto the lifting device 15 by the lower side transfer device 37b, and the process-finished object 11 arranged on the substrate holding device 27 can be taken to the air atmosphere form the loading/unloading chamber 30.

Figure 13:
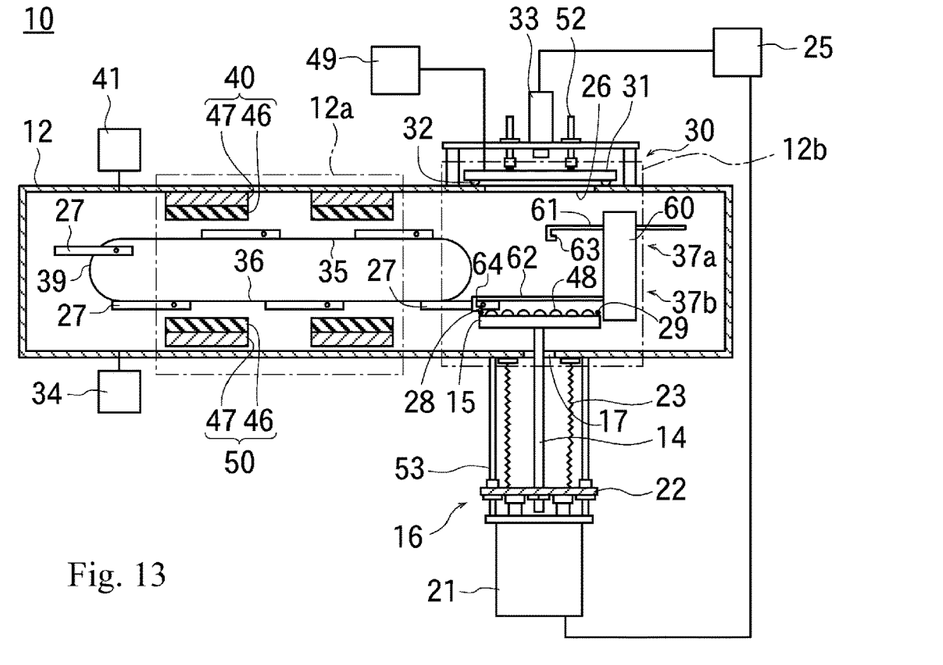
FIG. 13 illustrates another example (1) of the vacuum processing apparatus.

In the foregoing example, the upper side hooks 44 and the lower side hooks 45 are movably arranged on the upper side sliders 42 and the lower side sliders 43. In another example, as shown in FIG. 13, an upper side hook 63 and a lower side hook 64 are provided on the tips of a horizontally extending upper side bar member 61 and a horizontally extending lower side bar member 62, respectively, and the upper side bar member 61 and the lower side bar member 62 are arranged on upper and lower part of the lifting region 12b, respectively. By moving the upper side bar member 61 and the lower side bar member 62 up and down, the upper side hook 63 and the pin 28 are engaged and disengaged, and the lower side hook 64 and the pin 28 are engaged and disengaged.

The upper side bar member 61 and the lower side bar member 62 are attached to a bar member moving device 60. The upper side bar member 61 and the lower side bar member 62 are configured to move individually along the extending direction of their center axes when the bar member moving device 60 is operated. The upper side bar member 61 and the lower side bar member 62 are horizontally arranged and reciprocate on a straight line.

When the upper side hook 63 or the lower side hook 64 are inserted into between the pin 28 and the processing region 12a, the upper side hook 63 and the pin 28, or the lower side hook 64 and the pin 28, are engaged with each other in the direction in which the substrate holding device 27 moves away from the processing region 12a side. When the upper side bar member 61 or the lower side bar member 62 in the engaged state move in the direction away from the processing region 12a, the substrate holding device 27 moves in the direction away from the processing region 12a while rotating the rollers 48 on the lifting plate 15.

On the other hand, the upper side hook 63 or the lower side hook 64 may be arranged at a position farther from the processing region 12a than the pin 28, and engaged with the pin 28. In such a state, when the upper side bar member 61 or the lower side bar member 62 moves in a direction toward the processing region 12a, the substrate holding device 27 moves in the direction toward the processing region 12a while rotating the rollers 48 on the lifting plate 15.

As discussed above, the upper side transfer device 37a is constituted by the upper side bar member 61, the upper side hook 63, and the bar member moving device 60, and the lower side transfer device 37b is constituted by the lower side bar member 62, the lower side hook 64, and the bar member moving device 60.

Note that the upper side transfer device 37a and the lower side transfer device 37b are not limited to the device using hooks. For example, the upper side transfer device 37a and the lower side transfer device 37b may be configured by providing conveyance devices, such as, a belt conveyor, between the upper side moving device 35 and the lifting region 12b, and between the lower side moving device 36 and the lifting region 12b.

Figure 15:
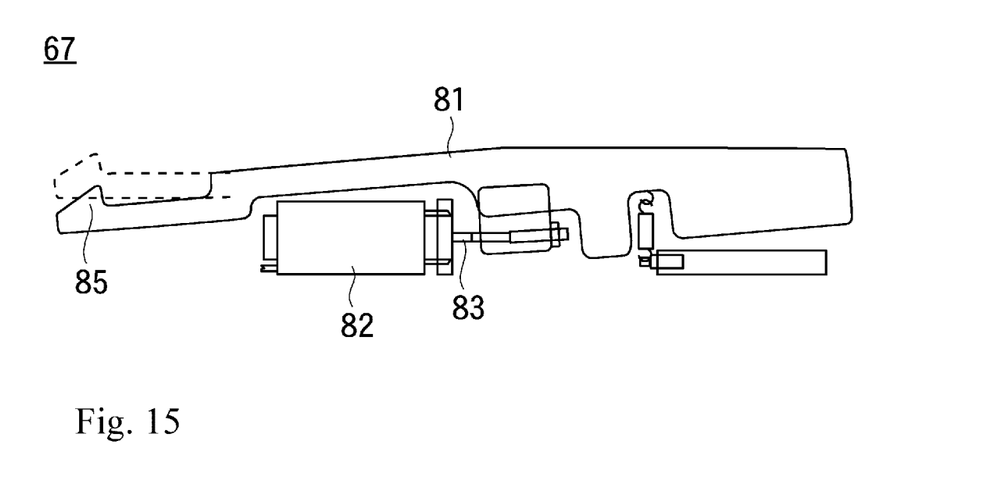
FIG. 15 is a diagram describing a swing hook.

With respect to FIG. 15, a swing hook 67 can be used instead of the upper side hook 44 or the lower side hook 45. A hook main body 81 of the swing hook 67 is rotatably attached to the upper side slider 42 or the lower side slider 43.

A protrusion 85 formed upward is provided at the front edge of the hook main body 81. A drive rod 83 which is moved to extend or contract by a solenoid 82 is rotatably attached to the hook main body 81.

When the solenoid 82 is activated to move the drive rod 82 toward the contracting direction, the hook main body 81 swings in a manner such that the protrusion 85 moves upward. When the drive rod 83 is moved in the extending direction, the hook main body 81 swings in a manner such that the protrusion 85 moves downward.

When the protrusion 85 moves upward, the protrusion 85 and the pin 28 can be engaged with each other. On the other hand, when the protrusion 85 engaged with the pin 28 moves downward, the protrusion 85 and the pin 28 are disengaged.

In such a manner, vertically-moving hooks may be provided on the upper side transfer device 37a and the lower side transfer device 37b, and the hooks can be vertically moved for engagement and disengagement. However, the transfer devices are not limited to vertically-moving hooks. For example, devices that rotationally move hooks for engagement and disengagement are also encompassed by the present embodiment.

Figure 14:
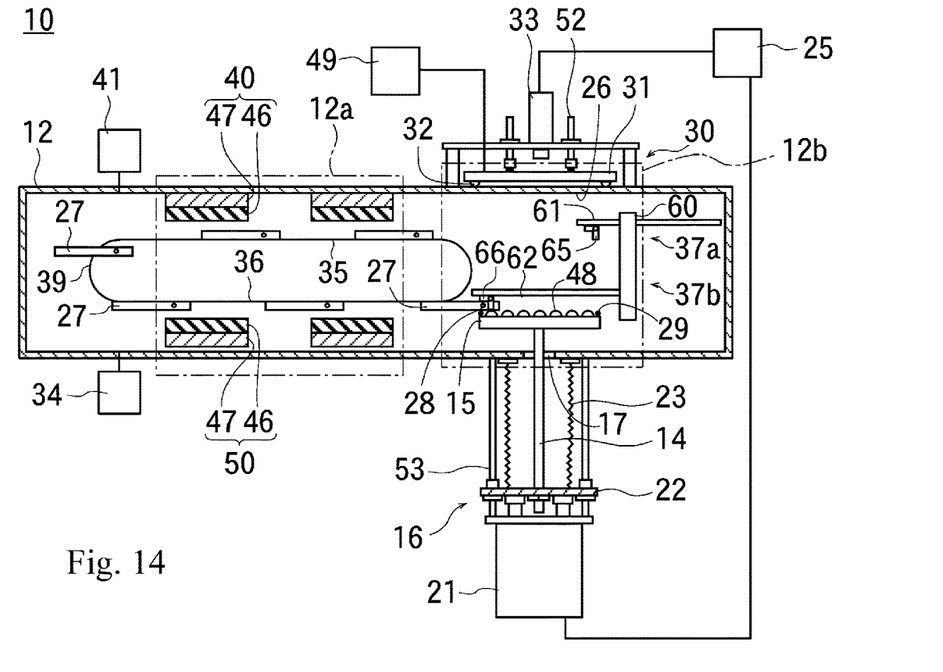
FIG. 14 illustrates another example (2) of the vacuum processing apparatus.

With respect to FIG. 14, an upper side hook 65 and a lower side hook 66 move rotationally. The upper side hook 65 and the lower side hook 66 are attached to the end of the upper side bar member 61 and the end of the lower side bar member 62, respectively.

The upper side bar member 61 and the lower side bar member 62 are horizontally arranged, respectively, and are configured to be capable of reciprocation on a straight line along the extending direction of the upper side bar member 61 and the lower side bar member 62 by the bar member moving device 60.

The substrate holding device 27 transferred to the upper side moving device 35 or the lower side moving device 36 is moved to the processing region 12a, and vacuum processing is performed on the object to be processed 11 arranged on the substrate holding device 27.

Because the upper side sliders 42 and the lower side sliders 43 discussed above can be replaced with a single slider device including the upper side hooks 44 and the lower side hooks 45, the transfer device 37 can be constituted by one slider device and two hooks without providing the upper side transfer device 37a or the lower side transfer device 37b.

When a slider device including a hook is attached to the lifting plate 15 in order not to prevent the lifting plate 15 from airtightly covering the opening 26, and the slider device is lifted up and down together with the lifting plate 15, the substrate holding device 27 can be transferred both between the lifting plate 15 and the upper side moving device 35 and between the lifting plate 15 and the lower side moving device 36 by moving the hook of the slider device. The transfer device 37 can thus be configured that the transfer is performed by one slider device and one hook, without providing the upper side transfer device or the lower side transfer device.

In the foregoing example, one substrate holding device 27 is arranged on one lifting plate 15. However, a plurality of substrate holding devices 27 may be arranged on one lifting plate 15.

Furthermore, a plurality of objects to be processed 11 may be arranged on one substrate holding device 27.

In the foregoing example, the lid unit 31 has a plate-like shape. However, the lid unit 31 may be configured as a lid unit of box shape tailored to the shape of the substrate holding device 27.

In the foregoing description, the processing region 12a and the lifting region 12b are described to communicate with each other and be in the vacuum environment of the same pressure. Due to imbalances such as a difference between the evacuation paths, an inevitable pressure difference occurs between the processing region 12a and the lifting region 12b. Because the pressure difference is negligibly small, the processing region 12a and the lifting region 12b are referred to as having the same pressure despite the presence of the inevitable pressure difference.

REFERENCE SIGNS LIST

10 . . . vacuum processing apparatus
11 . . . object to be processed
12 . . . vacuum chamber
12a . . . processing region
12b . . . lifting region
14 . . . lifting shaft
15 . . . lifting plate
16 . . . lifting device
17 . . . lifting hole
21 . . . lifting force generation device
22 . . . seat plate
23 . . . bellows
24 . . . open window portion
25 . . . control device
26 . . . opening
27 . . . substrate holding device
28 . . . pin
29 . . . inner hermetic seal ring
30 . . . loading/unloading chamber
31 . . . lid unit
32 . . . outer hermetic ring
33 . . . pressing device
35 . . . upper side moving device
36 . . . lower side moving device
37 . . . transfer device
37a . . . upper side transfer device
37b . . . lower side transfer device
39 . . . upper-to-lower transfer device
40 . . . upper side processing device
41 . . . gas introduction device
42 . . . upper side slider
43 . . . lower side slider
44, 67 . . . upper side hook
45, 67 . . . lower side hook
46 . . . sputtering target
47 . . . backing plate
48 . . . roller
50 . . . lower side processing device

What is claimed is:

1. A vacuum processing apparatus comprising:
a vacuum chamber in which a substrate holding device arranged with an object to be processed having an exposed processing surface, is loaded and unloaded;
a lifting device configured to lift the substrate holding device arranged on a lifting plate up and down in the vacuum chamber;
an upper side moving device configured to laterally move the substrate holding device in an upper part of the vacuum chamber;
a lower side moving device configured to laterally move the substrate holding device in a lower part of the vacuum chamber; and
a transfer device configured to transfer the substrate holding device between the lifting plate and the upper side moving device and between the lifting plate and the lower side moving device,
wherein the object to be processed is arranged on the substrate holding device moved by the upper side moving device and is vacuum-processed by an upper side processing device, and the object to be processed arranged on the substrate holding device moved by the lower side moving device is vacuum-processed by a lower side processing device.

2. The vacuum processing apparatus according to claim 1, further comprising:
an opening formed in the vacuum chamber and a lid member configured to cover the opening so as to form a loading/unloading chamber provided in an upper part of a range where the lifting plate moves up and down, and
wherein when the object to be processed arranged on the substrate holding device is inserted into the opening, the opening is closed by the lid member.

3. The vacuum processing apparatus according to claim 2, further comprising:
a vacuum evacuation device configured to vacuum evacuate the loading/unloading chamber.

4. The vacuum processing apparatus according to claim 1, further comprising:
an upper-to-lower transfer device configured to transfer the substrate holding device between the upper side moving device and the lower side moving device.

5. The vacuum processing apparatus according to claim 1, further comprising:
a pin provided on the substrate holding member; and
wherein the transfer device includes a hook configured to be engaged with the pin.

6. The vacuum processing apparatus according to claim 5, wherein the hook is configured to be disengaged from the pin by moving the hook either upward or downward.

7. The vacuum processing apparatus according to claim 1, the transfer device further includes:
an upper side transfer device configured to transfer the substrate holding device between the lifting plate and the upper side moving device; and
a lower side transfer device configured to transfer the substrate holding device between the lifting plate and the lower side moving device.

* * * * *